United States Patent [19]

Yamashita et al.

[11] Patent Number: 4,569,695
[45] Date of Patent: Feb. 11, 1986

[54] METHOD OF CLEANING A PHOTO-MASK

[75] Inventors: Hiromi Yamashita; Toshio Wada, both of Tokyo, Japan

[73] Assignee: NEC Corporation, Tokyo, Japan

[21] Appl. No.: 602,519

[22] Filed: Apr. 20, 1984

[30] Foreign Application Priority Data

Apr. 21, 1983 [JP] Japan .................................. 58-70494
Apr. 21, 1983 [JP] Japan .................................. 58-70495

[51] Int. Cl.⁴ .......................... B08B 1/02; B08B 1/04; B08B 6/00; B08B 7/04
[52] U.S. Cl. .................................... 134/1; 15/1.5 R; 15/77; 134/2; 134/3; 134/6; 134/9; 134/28; 134/29; 134/30; 134/31
[58] Field of Search ....................... 134/2, 3, 9, 28, 29, 134/30, 31, 199, 1, 6; 15/77, 1.5 R

[56] References Cited

U.S. PATENT DOCUMENTS

| | | | |
|---|---|---|---|
| 2,151,457 | 3/1939 | Williams | 134/28 X |
| 2,358,334 | 9/1944 | Knowlton | 15/77 X |
| 3,117,333 | 1/1964 | Murray et al. | 15/77 X |
| 3,691,582 | 9/1972 | Call | 134/9 X |
| 4,105,468 | 8/1978 | Geshner et al. | 134/28 X |
| 4,132,567 | 1/1979 | Blackwood | 134/30 X |
| 4,169,807 | 10/1979 | Zuber | 134/30 X |

Primary Examiner—Marc L. Caroff
Attorney, Agent, or Firm—Burns, Doane, Swecker & Mathis

[57] ABSTRACT

A photo-mask to be used in a light exposure step for manufacturing semiconductor devices is cleaned by wetting front and rear surfaces of the mask with a liquid, brushing the wetted surfaces with a pair of rotary brushes, wetting the brushed surfaces with an electrolytic solution containing sufficient electrolyte to substantially eliminate electrostatic charge from the surfaces, spraying and immersing the photo-mask in an organic liquid such as an alcohol, and then drying the photo-mask.

7 Claims, 6 Drawing Figures

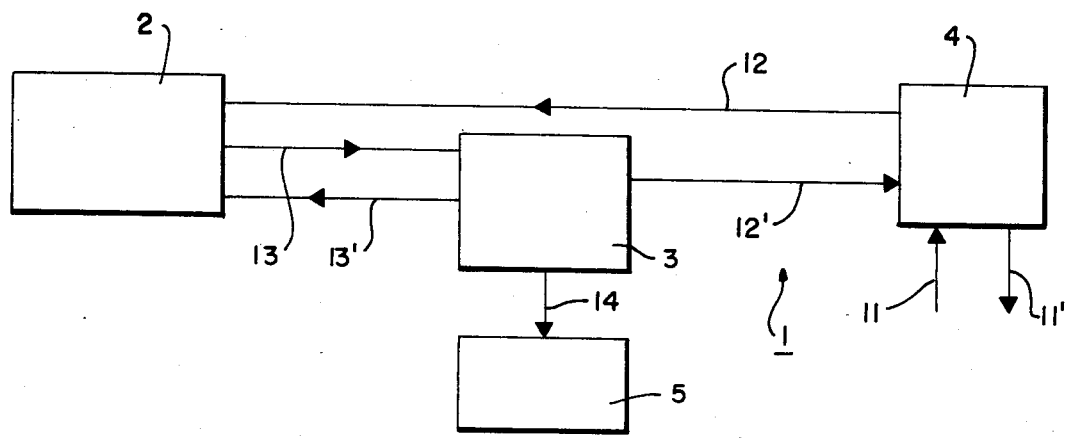
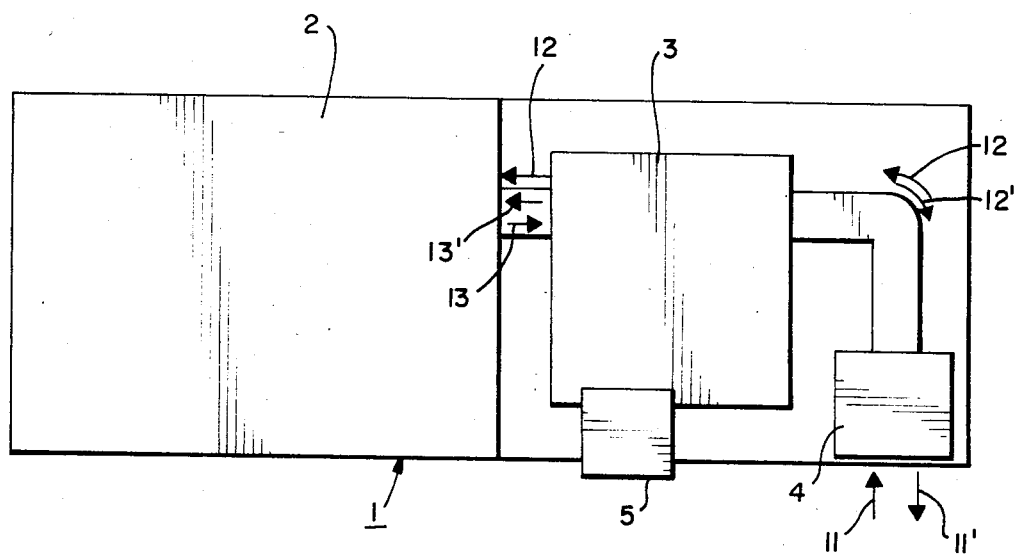
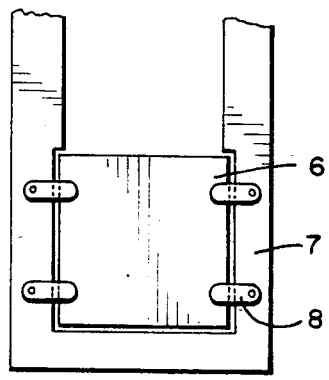

METHOD OF CLEANING A PHOTO-MASK

BACKGROUND OF THE INVENTION

1. Field of the Invention

The present invention relates to a method of cleaning a light exposure mask, that is a photo-mask, to be used for manufacturing of semiconductor devices such as IC's, LSI's, VLSI's, etc. (hereinafter called simply "mask") and a cleaning apparatus for practicing the method.

2. Description of the Prior Art

One of the important steps in a manufacturing process of semiconductor devices is a light exposure step. The mask to be used in this step must be free from dust or dirt. More particularly, straying dust would adhere on the front and rear surfaces of the mask because the electric charges are accumulated in the patterns on the mask by irradiating ultraviolet rays or far-ultraviolet rays in this step. In one method of cleaning the mask in the prior art, only brush-cleaning of either one or both of the front and rear surfaces of the mask was performed with the aid of a neutral detergent or pure water, and thereafter drying was effected by means of Freon. Alternatively, in another method of cleaning of the mask in the prior art, only shower-cleaning of either one or both of the front and rear surfaces of the mask was performed with the aid of a neutral detergent or pure water, and thereafter drying was effected by means of Freon. However, the former method would cause electrostatic breakdown in the pattern on the mask and also had a poor cleaning effect. The latter method was poorer in the cleaning effect than the former method. Consequently, there was a posibility that the influence of dust on the mask cleaned by the prior art method would be generated in semiconductor clips of 5% or more in a semiconductor wafer. Furthermore, in a reduced-size projection light exposure apparatus, a reticle mask used in the apparatus must be free from dust of 3 μm or more in size and stains or contaminations produced upon drying of a cleaning liquid. However, a mask cleaning technique which fulfils such type of requirements and which has a good workability has not been known. On the other hand, to inspect a cleaning effect, that is, an extent of removal of dust and the like in a mask after cleaning, is an important factor for dertermining the product yield of semiconductor elements. Quality control of a mask after cleaning in the prior art, however, was directly effected in some cases by means of a microscope, and in other cases it was effected by mounting the mask to a light exposure apparatus, carrying out light exposure of a semiconductor substrate coated with a photo-resist and then observing the produced photo-resist pattern by means of a microscope. The time and labor necessitated for this observation are immeasurable.

SUMMARY OF THE INVENTION

One object of the present invention is to provide a method of cleaning a mask which method is excellent in workability and can reliably remove dust and the like adsorbed on the front and rear surfaces of the mask, and an apparatus for practicing the same method.

According to one feature of the present invention, there is provided a method of cleaning a photo-mask, such as a reticle mask, to be used in a light exposure step for manufacturing semiconductor devices and having conductive or semiconductive patterns on a transparent substrate made of glass or quartz, the method comprising steps of a first step of wetting the front and rear surfaces of the mask with liquid by a shower-like manner, a second step of passing the mask through a gap between a pair of rotary brushes, a third step of making an electrolytic solution flow along the front and rear surfaces of said mask by a shower-like manner, a fourth step of making an organic liquid such as alcohol flow along the front and rear surfaces of said mask, and a fifth step of drying the front and rear surfaces of said mask after bringing the front and rear surfaces into contact with a vapor of an organic gas such as Freon. The liquid in the first step is favorably a weak acidic aqueous solution such as carbonic acid or a weak alkaline aqueous solution such as a dilute solution of ammonia. However, a weak acidic aqueous solution of phosphoric acid, hydrochloric acid, etc., or alcohol may be used. In the second step, adsorbed matters, adhering matters, contaminations, stains, etc. on the front and rear surfaces of the mask can be mechanically removed. The mask has been wetted with electrolytic solution such as dilute solution of ammonia in the first step, charges would not be accumulated in the second step of mechanical scrubbing step. Moreover, the third step is conducted for eliminating electrical charges completely. The electrolytic solution in the third step employs the same solution in the first step. In addition, in the case of employing an alkaline liquid such as ammonia, sodium hydroxide, potassium hydroxide, etc. as the electrolytic solution, fingerprints, oily contaminations and the like adhering onto the mask can be removed. Furthermore, owing to the fact that an aqueous solution remaining upon cleaning a mask is replaced by alcohol in the fourth step and vapor cleaning-drying by means of an organic gas in the fifth step is effected, a drying speed is fast and residual stains as will be observed upon natural drying of an aqueous solution can be perfectly eliminated.

According to another feature of the present invention, there is provided a method of cleaning automatically a photo-mask to be used in a light exposure step for manufacturing semiconductor devices comprising steps of containing the mask in a protecting case, inserting the protecting case into a case accommodating section, taking out automatically the mask from the protecting case and supporting automatically the mask by support member at its pheripheral portion so as to expose the most part of the front and rear surfaces of the mask in the accommodating section, transporting automatically the mask with the support member to a cleaning section, cleaning automatically the mask in the cleaning section, transporting automatically the mask with the support member to a dust inspection section, inspecting automatically the mask in the dust inspection section, transporting automatically the mask with the support member to the case accommodating section when the result of the inspection is acceptable and to the cleaning section to re-clean the mask when the result of the inspection is unacceptable, releasing automatically the acceptable mask from the support member and setting automatically it into the protecting case, and taking out the protecting case containing the acceptable mask from the case accommodating section.

According to another aspect of the present invention, there is provided an apparatus for cleaning a photo-mask to be used for manufacturing of semiconductor devices, comprising means for holding at least a part of the periphery of the mask, mechanical cleaning means for wetting the surfaces of the mask with liquid and brushing the surfaces, means for spraying an electrolytic solution onto the front and rear surfaces of the mask, means for spraying organic chemicals onto the front and rear surfaces of the mask, and means for vapor-cleaning and drying the mask by means of an organic gas.

According to further aspect of the present invention, there is provided an apparatus for cleaning a photomask, comprising means for bringing the mask to be cleaned into a cleaning section and taking it out of the cleaning section after cleaning, means for detecting dust remaining on the taken-out mask and determing whether the result of cleaning is good or bad, means for again bringing the mask into the cleaning section in the event that the result is bad, and means for bringing the mask into mask protecting case within a mask accommodaing section in the event that the result is good.

According to the present invention, the cleaning apparatus is provided with an automatic dust detection and determination capability, which makes it possible to detect dust remaining on a mask after cleaning, for example, by scanning the mask with laser rays and sensing a light scattered by the dust, and to repeatedly clean the mask on the basis of the information obtained by the detection of the dust until an acceptable mask is obtained, and further a capability of automatically accommodating the acceptable mask obtained as a result of the cleaning or the repeated cleaning in a mask protecting case for protecting the acceptable mask from straying dust or the like. Moreover, since inspection of a mask after cleaning is performed automatically by means of laser rays, the inspection time is shortened and the inspection can be carried out accurately. Still further, in the event that the result of inspection proves that a predetermined amount of dust still adheres to the mask, the mask is again sent to a cleaning section automatically to be cleaned, and hence, a mask coming out of the cleaning apparatus according to the present invention is a mask for which predetermined cleaning has been completed. Accordingly, a predetermined yield can be obtained for the semiconductor devices fabricated by making use of a mask cleaned according the present invention. In addition, upon application to a reduced-size projection type light exposure apparatus (stepper), since an acceptable mask can be directly handled while it is kept accommodated in a mask protecting case, it has become possible to eliminate the possibility of adhesion of every dust during the period from confirmation of an acceptable mask after cleaning until mounting of the mask to a stepper, common defects in a repeated pattern to be transferred onto a semiconductor substrate can be easily removed, and hence it becomes possible to greatly improve a utilization efficiency of a stepper. Accordingly, practical advantages of the present invention are very great.

BRIEF DESCRIPTION OF THE DRAWINGS

One preferred embodiment of the present invention is illustrated in FIGS. 1 to 6 of the accompanying drawings, wherein:

FIG. 1 is a block diagram showing relations between respective sections,

FIG. 2 is a schematic view showing an outline of relative arrangement of the respective sections, FIG. 4 is a front view showing the mode of supporting a mask by means of a support member in a cleaning section, in an inspecting section and in respective transport sections.

DESCRIPTION OF A PREFFERED EMBODIMENT

Figure 3:
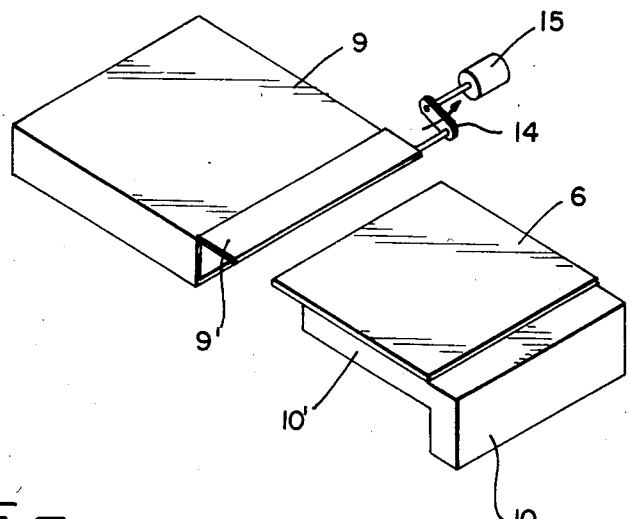
FIG. 3 is a perspective view showing the mode of loading and unloading a mask into and from a protecting case.

At first, an outline of the present invention will be described with reference to FIGS. 1 and 2. As indicated by arrow 11, a protecting case containing a mask therein is inserted in a case accommodating section 4. Next, the mask is passed through an automatic dust inspecting section 3 and is sent to a mask cleaning section 2. This flow is indicated by arrow 12. It is to be noted that during the above-mentioned step, either dust on a mask before cleaning could be checked or could not be checked in the automatic dust inspecting section 3. A mask having completed cleaning in the cleaning section 2 is sent to the automatic dust inspection section 3 as shown by arrow 13, and it is inspected in this section. Through this inspection, an amount and sizes of dust remaining on the mask are quantitatively detected, and a mask fulfilling preset reference conditions is determined to be acceptable, hence is sent to a case accommodating section 4 as shown by arrow 12' and is again loaded into a protecting case and discharged externally as shown by arrow 11'. On the other hand, in the event that a mask has been determined to be unacceptable, again it is sent to the cleaning section 2 as shown by arrow 13' to be subjected to cleaning, then inspection of residual dust is again performed, and if the mask is again determined to be unacceptable, similar cleaning and dust inspection are repeated. If a mask can be determined to be acceptable within a preset limit number of repetitions of the cleaning and dust inspection, then it is automatically loaded into an mask protecting case, and thereby the cleaning by means of the apparatus according to the present invention is completed. In other words, transport between the respective sections as well as processings in the respective sections are all performed automatically. The results of the dust inspection are output as indicated by arrow 14, for instance, is displayed on a CRT 5 to be confirmed by an operator, and further they are stored as inspection data.

FIG. 3 shows the mode of loading and unloading a mask 6 into and from a protecting case 9 within a case accommodating section. In more particular, a side lid portion 9' of the protecting case 9 is opened and closed by means of a motor 15 and a shaft 14 connected thereto. When this lid portion 9' is opened, a projected fork 10' of a fork lift mechanism is inserted into the protecting case 9 to take out a mask 6 as placed on the fork 10'. When a mask 6 is to be loaded into the protecting case 9 also, a similar operation is performed. The mask 6 is automatically transferred from this fork lift mechanism 10 to a support member 7 shown in FIG. 4. With reference to FIG. 4, the support member 7 is provided with rotary claws 8, and these claws 8 also can be rotated automatically. This support member 7 supports only a peripheral portion of a mask 6, and it carries out the transfers at the locations indicated by arrows 12, 12', 13 and 13' and the processings in the inspecting section 3 and the cleaning section 2 in FIGS.

1 and 2, while maintaining the most part of the front and rear surfaces of the mask 6 in an exposed condition. The support member 7 is generally transported by a robot, and it is rotatable so that in the inspecting section 3 the mask 6 may be held horizontally, while in the cleaning section 2 it may be held vertically.

Figure 5:
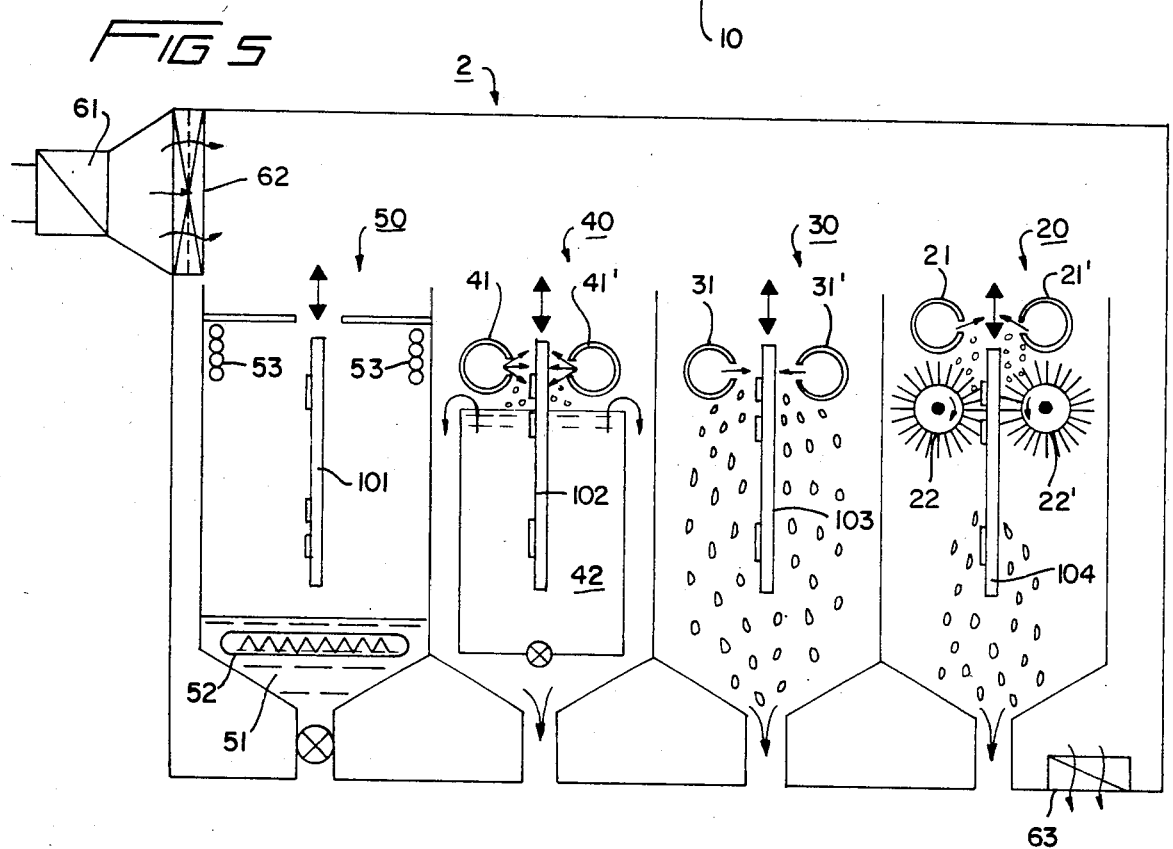
FIG. 5 is a schematic view showing a cleaning section.

FIG. 5 schematically shows the cleaning section 2. In this figure, masks are designated by reference numerals 101, 102, 103 and 104. The support member shown in FIG. 4 and a robot for carrying out an automatic processing are omitted from FIG. 5 for the purpose of avoiding complexity. In the illustrated embodiment of the cleaning section, there are provided four cleaning tanks 20, 30, 40 and 50 for cleaning, in the successive steps, masks 101, 102, 103 and 104 to be used for fabrication of semiconductor devices, which masks are formed by depositing a shading pattern of a necessary configuration made of chromium on one surface of a transparent quartz substrate. The respective cleaning tanks can simultaneously clean the front and rear surfaces of a mask to be cleaned, and to the end, the mask is held at its at least one end portion by means of an appropriate jig such as the support member 7 shown in FIG. 4 and is moved up and down within the respective cleaning tanks.

In a first cleaning tank 20, a mask is passed through a gap between a pair of opposed shower pipes 21 and 21' for the purpose of wetting the front and rear surfaces of the mask 104 to be cleaned, with aqueous ammonia of 1% or less. The mask passed through this gap is further passed through a gap between a pair of rotary bushes 22 and 22' made of nylon to have its front and rear surfaces scrubbed thereby. The directions of rotation of these rotary brushes are such directions that they may sweep over the mask surfaces from the top to the bottom as shown in FIG. 5. In addition, the rotary brushes 22 and 22' may spray, in some cases, similar liquid to that sprayed from the pipes 21 and 21', from their center portions towards the mask surfaces. In this way, in this cleaning tank 20 are carried out the first step of wetting the front and rear surfaces of the mask and the second step of mechanically sweeping over the front and rear surfaces of the mask by means of the rotary brushes.

Subsequently, the mask to be cleaned is subjected to shower cleaning with an electrolytic solution in a second cleaning tank 30. In this cleaning tank 30, necessarily an electrolytic solution flows out of a pair of shower pipes 31 and 31', and by passing the mask 103 through the gap between these shower pipes, the electrolytic solution is made to flow along the front and rear surfaces of the mask. In this third step performed in the second cleaning tank 30, electrostatic charge accumulated during the brush cleaning in the preceding stage as well as during use of the mask is completely removed, and thereby dust on the front and rear surfaces of the mask is released from static electricity and removed by the flowing electrolytic solution. For the electrolytic solution to be used in this step, aqueous ammonia or aqueous carbonic acid having a concentration of 0.1% to about 2% is conveniently available. The electrolytic solution flowing through the shower pipes 31 and 31' in the second cleaning tank 30 may be, if necessary, switched to pure water after finishment of the cleaning to rinse out the electrolytic solution adhering onto the front and rear surfaces of the mask. The above-described concentrations of the electrolytic solutions are represented in weight %.

In a third cleaning tank 40, for the purpose of replacing the aqueous solutions used in the preceding steps by an organic liquid, a mask 102 to be cleaned is passed through a gap between a pair of shower pipes 41 and 41', then it is immersed in an isopropyl alcohol bath 42, and then, after it is again sprayed with isopropyl alcohol ejected from the shower pipes 41 and 41', it may be delivered to a fourth cleaning tank 50. The alcohol used in this step is not limited to isoprophy alcohol, but other alcohol series chemicals such as methanol, ethanol, etc. could be employed. The alcohol bath 42 is supplied with the alcohol ejected from the shower pipes 41 and 41', and the alcohol would overflow beyond all the wall edges on the four sides and then would flow out externally.

A mask 101 to be cleaned which has been delivered to the fourth cleaning tank 50 makes contact with a Freon vapor, which is produced above a liquid level of Freon 51 by heating the Freon 51 up to 50° to 60° C. by means of a heater 52, and thereby the mask 101 is subjected to vapor-cleaning. Still further, the mask is quickly dried when it is taken out upwardly while passing by a cooler 53 provided in the upper portion of this cleaning tank 50. The cooler 53 prevents a Freon vapor produced in the lower portion of the tank 50 from flowing out of the tank by passing water at 10° to 28° C. through metallic pipes, and thereby it suppresses consumption of Freon and also quickly performs drying of a mask. This step of vapor-cleaning-drying by means of an organic chemical gas can be also achieved by means of isopropyl alcohol, and a similar effect to that described above can be obtained by changing the set temperatures of the heater 52 and the cooler 53. In addition, it is to be noted that the vertical reciprocating motion of the mask in the respective tanks as shown by arrows could be carried out either once or a plurality of times, that is, it could be repeated any times according to necessity. The mask cleaning section 2 in FIG. 5, which carries out the above-mentioned method of cleaning according to the present invention, includes four cleaning tanks 20, 30, 40 and 50 for successively processing a mask to be cleaned, and there are provided means for transporting masks to these cleaning tanks as well as means for vertically reciprocating the masks in the respective tanks. Furthermore, the respective tanks are externally shielded from an external atmosphere, clean air which has passed through a dust-removing filter 61 and an electrolytically dissociated ion shower 62, is introduced into the shielded space, while air is discharged through an exhaust manifold 63, and thereby maintenance of cleanness and prevention of generation of static electricity within the cleaning section 2 can be achieved.

According to the above-described embodiment of the present invention, deposits and contaminations on the surfaces of a mask to be cleaned are perfectly cleaned through the steps of scrubbing→electrolyte cleaning→organic gas cleaning→quick drying, substantially over the entire front and rear surfaces. In addition, as compared to the heretofore known cleaning process, the cleaning process according to the present invention is short in time and excellent in workability, and it can realize perfectness in the steps of the cleaning process as well as reasonable cleaning treatment. Accordingly, the method of cleaning according to the present invention is an especially advantageous method for cleaning of a reticle mask, which necessitate dustless and contaminationless cleaning.

Figure 6:
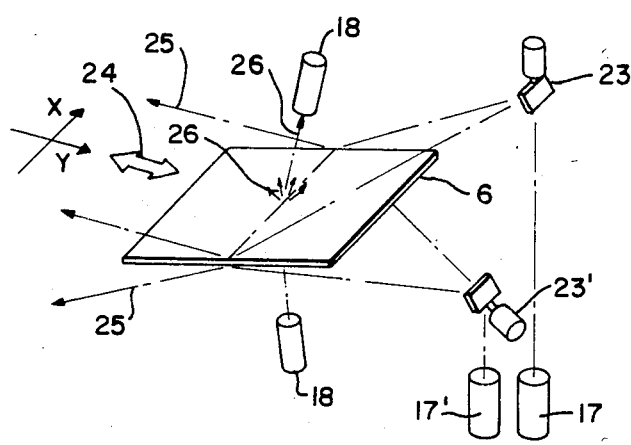
FIG. 6 is a schematic view showing an inspection section.

Now an automatic dust inspecting section 3 that is available in the illustrated embodiment of cleaning apparatus according to the present invention will be explained in more detail with reference to FIG. 6. A mask 6 to be inspected is held horizontally and moved precisely in Y direction. Laser light from a laser head 17 is reflected by the mirror 23 and irradiated to the front surface of the mask 6. The most of incident laser light is changed as reflected light 25 and is not detected by the photo-detector 18. However, if residual dust 19 is present on the front surface of the mask, the incident laser light is changed to scattered light 26 and detected its largeness by the photo-detector 18. The mirror 23 can scan the incident laser light in X direction at right angles with the Y direction. Also, the condition of the rear surface of the mask 6 is inspected by a laser head 17', a scanning mirror 23' and a photo-detector 18'.

What is claimed is:

1. A method of cleaning a photo-mask to be used in a light exposure step for manufacturing semiconductor devices comprising the steps of wetting front and rear surfaces of said mask with liquid, passing said mask through a gap between a pair of rotary brushes and brushing said front and rear surfaces with said rotary brushes, making an electrolytic solution flow along said front and rear surfaces of said mask, said electrolytic solution containing sufficient electrolyte to substantially eliminate electrostatic charge from said surfaces, making an organic liquid flow along said front and rear surfaces of said mask, and drying said front and rear surfaces of said mask.

2. A method of claim 1, in which said liquid in said first step is a dilute solution of ammonia.

3. A method of claim 1, in which said liquid in said first step is a weak acidic aqueous solution containing carbonic acid.

4. A method of claim 1, in which said electrolytic solution in said third step is a dilute solution of ammonia.

5. A method of claim 1, in which said electrolytic solution in said third step is a weak acidic aqueous solution containing carbonic acid.

6. A method of claim 1, in which said organic liquid in said fourth step is an alcohol.

7. A method of claim 1, in which said drying step is conducted by contacting the photo-mask with an organic gas.

* * * * *